BROAD-BAND ELECTRIC AMPLIFIER WITH PLURAL OUTPUTS AT DIFFERENT POTENTIAL LEVELS

Filed July 2, 1962

United States Patent Office 3,127,472
Patented Mar. 31, 1964

3,127,472

BROAD-BAND ELECTRIC AMPLIFIER WITH PLURAL OUTPUTS AT DIFFERENT POTENTIAL LEVELS

Michael B. Cumbers, Wembley, and Eric Ribchester, Hanworth, England, assignors to Hazeltine Research, Inc., Chicago, Ill., a corporation of Illinois Filed July 2, 1962, Ser. No. 206,710
Claims priority, application Great Britain July 12, 1961
3 Claims. (Cl. 178—5.4)

Figure 1:
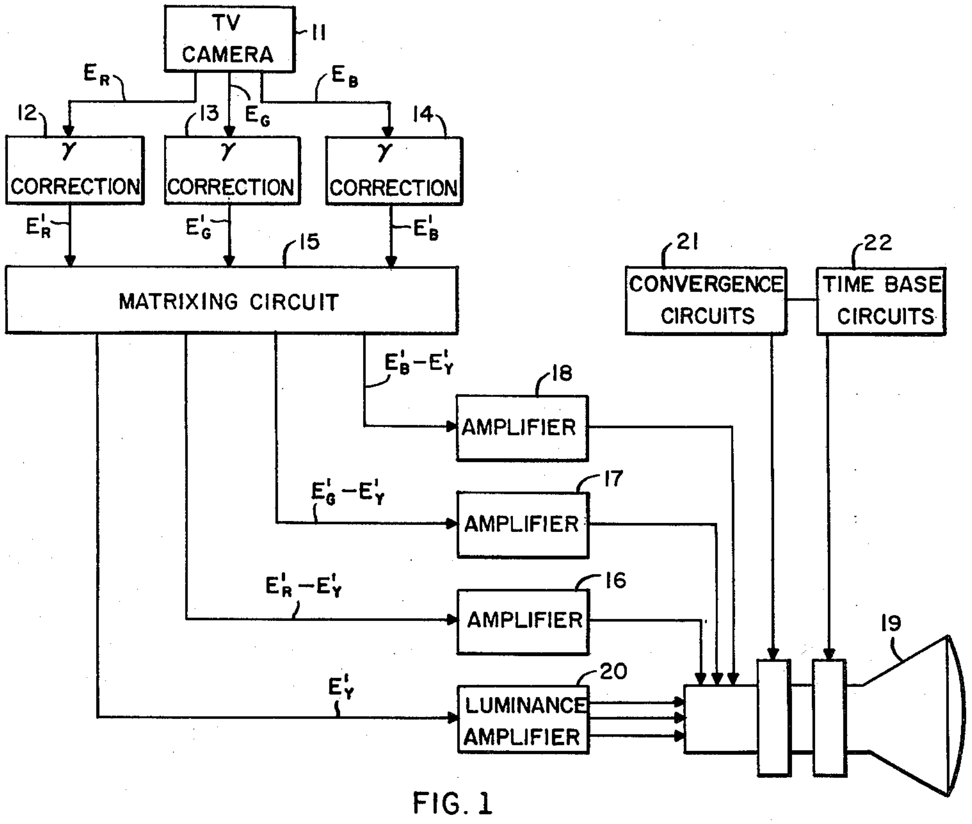

This invention relates to broad-band electric amplifier circuits.

Generally, the range of frequencies which will pass through a given electronic amplifier without significant amplitude or phase distortion is limited by the nature of the load impedance of the amplifier. In the simple case, this load or output impedance consists of the combination of any shunt capacitance to ground in the output circuit, the load resistor of the given amplifier, the coupling capacitor connecting the amplifier to any succeeding device and the input resistance of the succeeding device.

Many design techniques are presently known for improving the frequency response of such simple amplifiers. Broad-band performance may be achieved, for example, by combining the above-mentioned output impedance elements with additional compensating reactive elements to form either two or four terminal networks which display broad-band characteristics.

However, in some cases (e.g. the luminance amplifier of a color-television image-reproduction system), it is desirable to provide a plurality of broad-band output signals at different amplitude levels from a single amplifier. The known two or four terminal networks which display sufficiently broad-band characteristics for this application inherently provide a single output.

It is an object of the present invention, therefore, to provide an arrangement which substantially avoids one or more of the limitations of the described prior arrangements.

It is a further object of the present invention to provide a broad-band electric amplifier circuit which, in operation, provides a plurality of outputs at different amplitude levels.

According to the invention, a broad-band electric amplifier circuit comprises an electric amplifying element; a load for said element comprising a capacitance, between the terminals of which the output from said element is applied, a resistance and a parallel tuned circuit connected in series between the terminals of the capacitance, and a plurality of substantially identical series tuned circuits respectively connected between different points on the resistance and the end of the parallel tuned circuit remote from the resistance, the series tuned circuits having a resonant frequency of at least 300 kilocycles/second and the parallel tuned circuit having a resonant frequency several times that of the series tuned circuits; and means for deriving a plurality of outputs respectively from across the capacitances in said series tuned circuits.

In a preferred arrangement in accordance with the invention, the ratio of the value of the first-mentioned capacitance to the value of the capacitance in the parallel tuned circuit to the value of each of the capacitances in the series tuned circuits is approximately $0.5:0.2:1/n$, the ratio of the value of the inductance in the parallel tuned circuit to the value of each of the inductances in the series tuned circuits is approximately $0.2:n\times0.7$ where $n$ is the number of series tuned circuits, and the value of said resistance is approximately equal to the value of the impedance of the inductance in the parallel tuned circuit at the resonant frequency of that tuned circuit.

With such an arrangement a particularly good response to transients is obtained.

While the invention has general application, and is particularly well-adapted for use in color-television receivers, it will be described in connection with a color-television monitoring apparatus for the sake of simplicity.

For a better understanding of the present invention, together with other and further objects thereof, reference is had to the following description taken in connection with the accompanying drawing and the scope will be pointed out in the appended claims.

Figure 2:
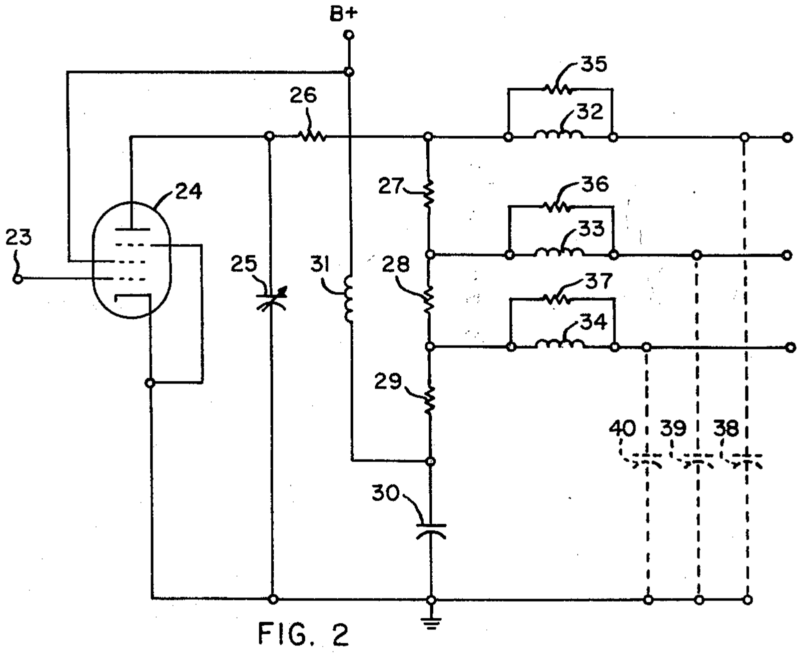

Referring to the drawing:

FIGURE 1 is a block schematic diagram of a color-television apparatus for monitoring the signals appearing at the output of a color-television camera, and FIGURE 2 is a circuit diagram of part of the apparatus shown in FIGURE 1.

Referring to FIGURE 1 of the drawing, the camera 11 is arranged to produce simultaneously three output signals $E_R$, $E_G$ and $E_B$ which are respectively representative of red, green and blue components of a scene to be televised, the magnitudes of the three signals being equal for a white portion of the scene. The camera output signals are respectively fed to three gamma correcting circuits 12, 13 and 14, whose outputs $E'_R$, $E'_G$ and $E'_B$ are fed to a matrixing circuit 15.

In matrixing circuit 15, the gamma corrected camera output signals $E'_R$, $E'_G$ and $E'_B$ are combined in proportion to their contributions to the total luminance of the scene to be televised to produce a luminance signal $E'_Y$ (equal to $0.30\,E'_R+0.59\,E'_G+0.11\,E'_B$) representative of the luminance of the scene to be televised; in addition, each of the signals $E'_R$, $E'_G$, $E'_B$ is individually combined with the signal $E'_Y$ to produce red, green and blue color-difference signals $E'_R-E'_Y$, $E'_G-E'_Y$ and $E_B-E'_Y$, these three last-mentioned signals being together representative of the chrominance of the scene to be televised.

The three color-difference signals are respectively fed to the inputs of three amplifiers 16, 17 and 18 at whose outputs there appear red, green and blue color-difference signals $E'_R-E'_Y$, $0.8\,(E'_G-E'_Y)$ and $0.6\,(E'_B-E'_Y)$, respectively, these signals being respectively fed to the cathodes of the red, green and blue electron guns of a three-color cathode-ray tube 19.

The luminance signal is fed to the input of a luminance amplifier 20 at whose output there appear three signals $E'_Y$, $0.8\,E'_Y$ and $0.6\,E'_Y$, these signals being respectively applied to the red, green and blue electron guns of cathode-ray tube 19 in such a sense that the net signal voltages applied to the electron guns correspond to $E'_R$, $0.8\,E'_G$ and $0.6\,E'_B$.

Cathode-ray tube 19, which may be of the type 21AXP22A supplied by the Radio Corporation of America, is arranged to produce a picture of the scene to be televised in response to the applied signals, the necessary convergence and scanning voltages being derived from conventional convergence circuits 21 and time base circuits 22 whose operation is synchronized with that of camera 11.

Referring now to FIGURE 2 of the drawing, the final stage of luminance amplifier 20 includes a pentode amplifier 24. The output of the previous stage (not shown) of luminance amplifier 20 is applied to control grid 23 of pentode 24. The cathode of pentode 24 is connected to ground, the suppressor grid of pentode 24 is directly connected to the cathode of pentode 24 and the screen grid of pentode 24 is connected to the positive terminal of a high voltage supply (B+) whose negative terminal is connected to ground, the B+ supply providing a voltage of 250 volts. The anode load of pentode 24 is constituted by a network comprising: a capacitor 25 connected between the anode of pentode 24 and ground, the value of capacitor 25 being variable between 1 and 5 picofarads and being adjusted so as to provide, in combination with the anode-cathode capacitance of pentode 24, a total capacitance of 12 picofarads between the anode of pentode 24 and ground; four resistors 26, 27, 28 and 29 and a capacitor 30 connected in series, in the order stated, between the anode of pentode 24 and ground, resistors 26, 27, 28 and 29 respectively having values of 33 ohms, 340 ohms, 340 ohms and 1100 ohms and capacitor 30 having a value of 5 picofarads; an inductor 31 of value 20 microhenries connected between the junction of resistor 29 and capacitor 30 and the positive terminal of the B+ supply, this inductor 31 forming a parallel tuned circuit with capacitor 30; and three inductors 32, 33 and 34 respectively connected between the successive junctions between the resistors 26, 27, 28 and 29 and the cathodes of the red, green and blue electron guns of cathode-ray tube 19, each of the inductors 32, 33 and 34 having a value of 186 microhenries, being shunted by a separate resistor 35, 36 and 37 of value 10 kilohms, and forming a series tuned circuit with the cathode to ground capacitances 38, 39 and 40 of the relevant electron gun of cathode-ray tube 19, the value of each of these capacitances 38, 39 and 40 being 8 picofarads.

In operation of the receiver the three outputs from luminance amplifier 20 appear respectively between the cathodes of the red, green and blue electron guns of cathode-ray tube 19 and ground, the outputs having the desired relative amplitudes on account of the values of resistors 27, 28 and 29. The maximum gain of the amplifier is 37 db and the −3 db bandwidth for each output is 5 megacycles per second. The purpose of resistor 26 is to prevent the production of parasitic oscillations in the final stage of luminance amplifier 20 and resistors 35, 36 and 37 serve to damp any ringing oscillations produced in the inductors 32, 33 and 34.

It will be appreciated that the general configuration of the load in an amplifier circuit in accordance with the invention is such that any desired number of outputs at different amplitude levels may be derived from the amplifier without seriously impairing the performance of the amplifier as regards gain and bandwidth.

It will be understood that the values of the various components of the load in an electric amplifier circuit in accordance with the invention are chosen in accordance with the desired performance of the circuit. Thus, in other arrangements in accordance with the invention the values of the various components may differ from those in the arrangement described above, by way of example. Moreover, the amplifying element may be of any suitable type and may, for example, be a transistor instead of an electric discharge device.

The described arrangement of elements will provide a −3 db bandwidth of one megacycle or more if the series tuned circuits have a resonant frequency of at least 300 kilocycles per second and the parallel tuned circuit has a resonant frequency several times (e.g. greater than 3 times) that of the series tuned circuits.

Where a greater bandwidth (e.g. 5 megacycles as noted above) is required, the described arrangement of elements is capable of providing such performance where the component values are chosen according to the following relationships.

The ratio of the value of the total capacitance between the output terminal (e.g. anode) of the amplifying tube (e.g. pentode 24) and ground to the value of the capacitance in the parallel tuned circuit to the value of each of the capacitances in the series tuned circuits should be approximately $0.5:0.2:1/n$, where $n$ is the number of series tuned circuits. Furthermore, the ratio of the value of the inductance in the parallel tuned circuit to each of the inductances in the series tuned circuits should be approximately $0.2:n\times 0.7$, and the value of the total resistance in the voltage divider network connected across the terminals of the amplifying tube should be approximately equal to the value of the impedance of the inductance in the parallel tuned circuit at the resonant frequency of the tuned circuit.

While there has been described what, at present, is considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A broad-band electric amplifier circuit comprising:

an electric amplifying element;

a load for said element comprising a capacitance, between the terminals of which the output from said element is applied, a resistance and a parallel tuned circuit connected in series between the terminals of said capacitance, and a plurality of substantially identical series tuned circuits respectively connected between different points on said resistance and the end of said parallel tuned circuit remote from said resistance, said series tuned circuits having a resonant frequency of at least 300 kilocycles per second and said parallel tuned circuit having a resonant frequency several times that of said series tuned circuits;

and means for deriving a plurality of outputs respectively from across the capacitances in said series tuned circuits.

2. A broad-band electric amplifier circuit according to claim 1 wherein the ratio of the value of the first-mentioned capacitance to the value of the capacitance in the parallel tuned circuit to the value of each of the capacitances in the series tuned circuits is approximately $0.5:0.2:1/n$, the ratio of the value of the inductance in the parallel tuned circuit to the value of each of the inductances in the series tuned circuits is approximately $0.2:n\times 0.7$ where $n$ is the number of series tuned circuits, and the value of said resistance is approximately equal to the value of the impedance of the inductance in the parallel tuned circuit at the resonant frequency of that tuned circuit.

3. In a color-television image-reproducing system, a broad-band luminance amplifier circuit according to claim 2 wherein each of the capacitances in said series tuned circuits is the cathode to ground capacitance of one electron gun of a color-reproducing cathode-ray tube.

No references cited.